US009356169B2

(12) United States Patent
Lahav et al.

(10) Patent No.: US 9,356,169 B2
(45) Date of Patent: May 31, 2016

(54) APPARATUS, SYSTEM AND METHOD OF BACK SIDE ILLUMINATION (BSI) COMPLEMENTARY METAL-OXIDE-SEMICONDUCTOR (CMOS) PIXEL ARRAY

(71) Applicant: Tower Semiconductor Ltd., Migdal Haemek (IL)

(72) Inventors: Assaf Lahav, Binyamina (IL); Amos Fenigstein, Haifa (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 14/791,657

(22) Filed: Jul. 6, 2015

(65) Prior Publication Data

US 2016/0005896 A1    Jan. 7, 2016

Related U.S. Application Data

(60) Provisional application No. 62/021,152, filed on Jul. 6, 2014.

(51) Int. Cl.
*H01L 31/062*    (2012.01)
*H01L 31/0352*   (2006.01)
*H01L 27/146*    (2006.01)

(52) U.S. Cl.
CPC .... *H01L 31/035272* (2013.01); *H01L 27/1464* (2013.01); *H01L 27/14643* (2013.01)

(58) Field of Classification Search
CPC ............... H01L 27/1464; H01L 27/14643; H01L 27/3227; H01L 31/035272
USPC .......................... 257/292, 294, 432, 447, 460
See application file for complete search history.

(56) References Cited

U.S. PATENT DOCUMENTS

| 5,461,425 A | 10/1995 | Fowler et al. |
| 8,120,079 B2* | 2/2012 | Augusto ........... H01L 27/14669 257/184 |
| 8,735,953 B2* | 5/2014 | Gidon ............... H01L 27/14625 257/291 |
| 2009/0184387 A1* | 7/2009 | Takeuchi ............ H01L 27/1464 257/440 |

OTHER PUBLICATIONS

Etoh, Takeharu G., et al, "Toward One Giga Frames per Second—Evolution of in Situ Storage Image Sensors", Sensors 13.4 (2013): 4640-4658, published Apr. 8, 2013, 19 pages.

(Continued)

*Primary Examiner* — Hung Vu
(74) *Attorney, Agent, or Firm* — Shichrur & Co.

(57) ABSTRACT

Some demonstrative embodiments include devices and/or methods of Back Side Illumination (BSI) Complementary Metal-Oxide-Semiconductor (CMOS) pixel array. For example, a BSI CMOS pixel array may include a plurality of pixels, a pixel of the plurality of pixels may include one or more Metal-Oxide-Semiconductor (MOS) transistors comprising one or more well regions, a well region of the one or more well regions comprising an N-Well (NW) region or a P-well (PW) region; a photodiode; an epitaxial (epi) layer comprising an absorption area and a collection area, the absorption area to absorb incoming photons and to generate electrons responsive to absorbed photons, and the collection area connecting the absorption area to the photodiode to provide the electrons from the absorption area to the photodiode; and a barrier layer separating the absorption area from the one or more well regions.

20 Claims, 6 Drawing Sheets

(56) References Cited

OTHER PUBLICATIONS

Nae-In Lee et al., "Effect of the Silicidation Reaction Condition on the Gate Oxide Integrity in Ti-polycide Gate", Jpn. J. Appl. vol. 33, Jan. 1994, pp. 672-677, Part 1, No. 1B, 6 pages.

Naoya Watanabe et al., "Fabrication of Back-Side Illuminated Complementary Metal Oxide Semiconductor Image Sensor Using Compliant Bump", Japanese Journal of Applied Physics 49, 2010, 04DB01, 8 pages.

* cited by examiner

APPARATUS, SYSTEM AND METHOD OF BACK SIDE ILLUMINATION (BSI) COMPLEMENTARY METAL-OXIDE-SEMICONDUCTOR (CMOS) PIXEL ARRAY

CROSS REFERENCE

This Application claims the benefit of and priority of U.S. Provisional Patent Application No. 62/021,152 entitled "Apparatus, System and Method of Back Side Illumination Pixel Sensor", filed Jul. 6, 2014, the entire disclosure of which is incorporated herein by reference.

TECHNICAL FIELD

Embodiments described herein generally relate to apparatus, system and method of Back Side Illumination (BSI) Complementary Metal-Oxide-Semiconductor (CMOS) pixel array.

BACKGROUND

An imaging device, e.g., a camera, may include an image sensor to capture one or more images, photos, videos, and/or the like.

The image sensor may include a pixel array including a plurality of pixels. A pixel of the plurality of pixels may include a photodiode configured to convert light from the image to an electronic signal, for example, to enable processing the image.

The image sensor may be formed on a wafer, e.g., a substrate, using a Complementary Metal-Oxide-Semiconductor (CMOS) technology.

A Back Side Illumination (BSI) Complementary Metal-Oxide-Semiconductor (CMOS) image sensor may be illuminated from the back-side of the wafer, for example, after thinning the back-side of the wafer.

The BSI CMOS image sensor may have advantages over front-side illuminated image sensors. For example, metal interconnectors of the image sensor may not cast a shadow on light sensitive areas of the BSI CMOS image sensor.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

In the following detailed description, numerous specific details are set forth in order to provide a thorough understanding of some embodiments. However, it will be understood by persons of ordinary skill in the art that some embodiments may be practiced without these specific details. In other instances, well-known methods, procedures, components, units and/or circuits have not been described in detail so as not to obscure the discussion.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality", as used herein, include, for example, "multiple" or "two or more". For example, "a plurality of items" includes two or more items.

References to "one embodiment", "an embodiment", "demonstrative embodiment", "various embodiments" etc., indicate that the embodiment(s) so described may include a particular feature, structure, or characteristic, but not every embodiment necessarily includes the particular feature, structure, or characteristic. Further, repeated use of the phrase "in one embodiment" does not necessarily refer to the same embodiment, although it may.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

Some embodiments may be used in conjunction with various devices and systems, for example, an imaging device, a digital camera device, a video device, a camera module, a medical imaging device, a mobile computer, a laptop computer, a notebook computer, a tablet computer, a handheld computer, a handheld device, a Personal Digital Assistant (PDA) device, a handheld PDA device, a mobile or portable device, a consumer device, a Smartphone, and the like.

The terms "substrate" and/or "wafer", as used herein, may relate to a thin slice of semiconductor material, for example, a silicon crystal, which may be used in fabrication of integrated circuits and/or any other microelectronic devices. For example, the wafer may serve as the substrate for the microelectronic devices, which may be built in and over the wafer.

The term "Integrated Circuit" (IC), as used herein, may relate to a set of one or more electronic circuits on a semiconductor material. For example, the electronic circuit may include electronic components and their interconnectors.

Figure 1:
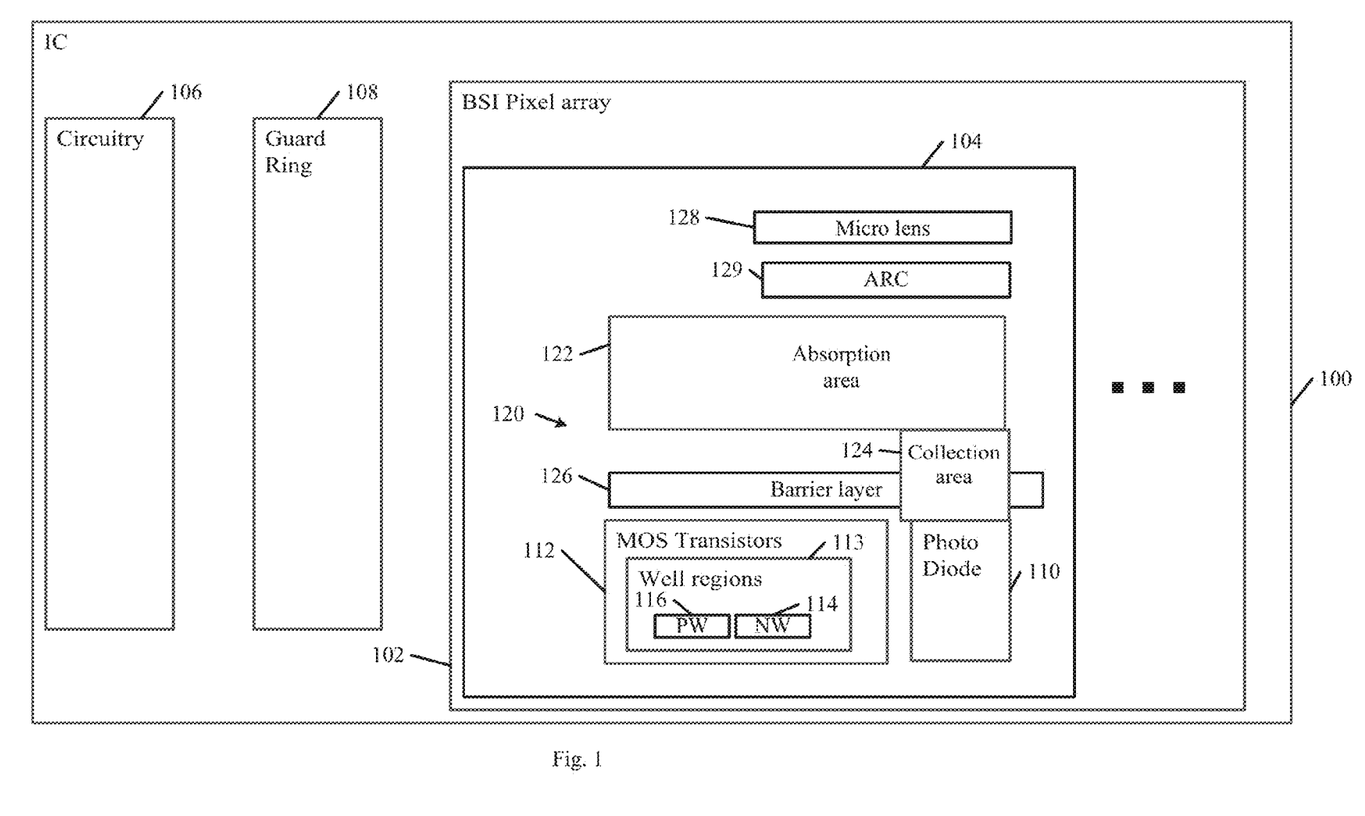
FIG. 1 is a schematic block diagram illustration of an integrated chip (IC), in accordance with some demonstrative embodiments.

Reference is made to FIG. 1, which schematically illustrates a block diagram of an Integrated Circuit (IC) 100, in accordance with some demonstrative embodiments.

In some demonstrative embodiments, IC 100 may be configured to capture, record, process, handle and/or store one or more images, photos, videos, movies, clips and/or the like.

In some demonstrative embodiments, IC 100 may be implemented as part of an imaging device, e.g., as described below with reference to FIG. 4. For example, IC 100 may be included as part of an imaging device, a digital camera, a medical imaging device, and the like.

In some demonstrative embodiments, IC 100 may be formed on a substrate, e.g., a wafer, for example using a Complementary Metal-Oxide-Semiconductor (CMOS) technology.

In some demonstrative embodiments, IC 100 may include a pixel array 102 configured to sense and/or to capture an image.

In some demonstrative embodiments, IC 100 may include a circuitry 106 configured to process, to handle, to amplify, to manipulate, and/or to perform any other additional or alternative operations on a photo signal of an image, e.g., captured by pixel array 102.

In some demonstrative embodiments, pixel array 102 may be at an internal area of IC 100, e.g., at the center of IC 100, and/or circuitry 106 may be at the periphery of IC 100.

In some demonstrative embodiments, circuitry 102 may include one or more processors, memory components, electronic components, and/or the like.

In some demonstrative embodiments, pixel array 102 may be configured to capture photons corresponding to an image and to convert the photons into electronic signals, for example, to enable circuitry 106 to process the image and/or to display the image on a display.

In some demonstrative embodiments, pixel array 102 may include a plurality of pixels 104.

In some demonstrative embodiments, a pixel 104 of the plurality of pixels 104 may be configured to capture incoming photons at an area of pixel 104, and to convert the photons into electronic signals.

In some demonstrative embodiments, pixel 104 may include a photodiode 110 configured to collect electrons, e.g., generated responsive to the incoming photons at the area of pixel 104.

In some demonstrative embodiments, photodiode 110 may be configured to generate the electronic signals, for example, based on the collected electrons.

In some demonstrative embodiments, photodiode 110 may include a fully pinned diode.

In some demonstrative embodiments, photodiode 110 may include a non-pinned diode.

In other embodiments, photodiode 110 may include any other diode, e.g., a partially pinned diode.

In some demonstrative embodiments, pixel array 102 may include a Back Side Illumination (BSI) pixel array.

In some demonstrative embodiments, the BSI pixel array may be configured to absorb light and/or to be illuminated from the backside of the wafer.

In some demonstrative embodiments, the BSI pixel array may include metal interconnectors and/or wiring, which may be located behind light sensitive elements of pixel array 102, e.g., photodiode 110, for example, compared to front side illuminated image sensors, in which the metal interconnectors and/or the wiring are located in front of the light sensitive elements.

In some demonstrative embodiments, the BSI pixel array may be able to capture an increased number of incoming photons from the image, for example, compared to the front side illuminated image sensors.

In one example, the BSI pixel array may be able to capture the increased number of incoming photons, for example, since the metal interconnectors of pixel array 102 may not cast a shadow on light sensitive areas of pixel array 102, e.g., photodiode 110.

In some demonstrative embodiments, photodiode 110 may include, and/or may perform the functionality of, a low fill factor diode, for example, a PD occupying a small part of pixel 104.

In some demonstrative embodiments, photodiode 110 may include a low fill factor diode, for example, to enable one or more electronic components and/or elements to be introduced inside pixel 104.

In other embodiments, photodiode 110 may include a low fill factor diode, for example, for any other reasons, e.g., physical reasons, design reasons, manufacturing reasons, and or any other reasons.

In some demonstrative embodiments, the one or more electronic components of pixel array 102 may be introduced inside pixel 104, for example, to perform one or more computational operations.

In one example, pixel 104 may be configured to perform the one or more computational operations, for example, in accordance with one or more requirements from one or more applications, e.g., imaging applications, video applications, photo applications, and/or any other applications.

In some demonstrative embodiments, pixel 104 may include one or more Metal-Oxide-Semiconductor (MOS) transistors 112, for example, to perform the computational operations.

In one example, pixel 104 may include a plurality of MOS transistors, e.g., many MOS transistors 112.

In some demonstrative embodiments, MOS transistors 112 may include one or more P-type MOS (PMOS) transistors and/or one or more N-type MOS (NMOS) transistors.

In some demonstrative embodiments, MOS transistors 112 may include one or more well regions 113.

In some demonstrative embodiments, a well region 113 may include an N-Well (NW) region 114 or a P-well (PW) region 116.

In one example, well region 113 may include an NW region 114, for example, of a PMOS transistor. For example, the PMOS transistor may be built over the NW region 114.

In another example, well region 113 may include PW region 116, for example, of an NMOS transistor. For example, the NMOS transistor may be built over the PW region 116.

In some demonstrative embodiments, well regions 113 may act as a parasitic photodiode.

In one example, NW region 114 may absorb electrons, e.g., generated responsive to the incoming photons at pixel array 102.

In one example, a photodiode in the BSI CMOS pixel sensor may be the biggest element of the pixel, e.g., compared to other elements of the BSI CMOS pixel. For example, the photodiode may occupy most of the area of the BSI CMOS pixel. Accordingly, most of the electrons generated by the incoming photons may be collected by the photodiode. If, for example, one or more MOS transistors are introduced into pixel 104, a size of photodiode 110 may be reduced and, as a result, well regions 113 may be able to collect a substantial amount of the electrons.

In some demonstrative embodiments, allowing a substantial amount of the electrons to be absorbed, for example, by the NW region 114, may reduce the number of electrons absorbed by photodiode 110, for example, if pixel 104 includes an electron-collecting pixel, e.g., as described below.

In some demonstrative embodiments, NW region 114 may be connected to a power supply, e.g., a VDD.

In some demonstrative embodiments, connecting the NW region 114 to the VDD may cause at least some of the electrons e.g., which may be generated responsive to the incoming photons at pixel array 102, to flow to the VDD.

In some demonstrative embodiments, NW region 114 may absorb a substantial amount of the electrons and, as a result, a reduced number of electrons may be collected by the photodiode 110.

In one example, the electrons may be generated in the well regions 113 of pixel 104. According to this example, a substantial amount of electrons, e.g., all electrons, which may be generated in NW region 114, may be lost and/or flow to the VDD and, as a result, may not contribute to a photo signal received by photodiode 110.

In some demonstrative embodiments, allowing a substantial amount of the electrons to be absorbed, for example, by the PW region 116, may affect the performance of pixel 104, for example, if pixel 104 includes an electron-collecting pixel.

In one example, absorption of the electrons in the PW region 116 may increase a probability of recombination of the electrons, and as a result, a reduced number of electrons may be collected by the photodiode 110.

In another example, absorption of the electrons in the PW region 116 may increase interference, e.g., "cross talk", between adjacent pixels, which may cause the photo signal to appear in an adjacent pixel.

In some demonstrative embodiments, only a small part of the electrons generated in the PW region 116 may diffuse to an area of photodiode 110, and may contribute to the photo signal. As photodiode 110 may occupy a small part of pixel 104, the electrons that are actually contributing to the photo signal may include electrons that are generated in photodiode 110, and/or electrons managing to diffuse from PW region 116 to photodiode 110, e.g., as described above.

In some demonstrative embodiments, covering the MOS transistors 112 with a metal layer, e.g., according to a "metallization" scheme of a front side illumination process, for example, may prevent the electrons from being absorbed in the NW region. However, some of the incoming photons may be lost, for example, due to reflections.

In some demonstrative embodiments, other conventional methods may not be effective for pixels having a very small diode, and/or pixels including MOS transistors, e.g., pixel 104.

In one example, a standard BSI technology may use a very thin silicon, and implementing the conventional methods may be very complicated, and/or it may be very hard to implement the conventional methods on a pixel having CMOS circuits.

For example, according to a BSI integration scheme, an electrostatic lens may be based on a double epitaxial (epi) layer, e.g., a p layer on an n layer, and the n layer may be fully depleted to direct electrons into a photodiode. This scheme may be very complicated and very hard to implement on a pixel with CMOS circuits, e.g., pixel 104.

In another example, a fully depleted BSI sensor may include a high-end charge-coupled device (CCD) sensor, which may increase Infra Red quantum efficiency. This approach may be difficult to implement in CMOS image sensors.

In some demonstrative embodiments, pixel 104 may be configured to reduce, eliminate and/or to prevent the electrons to be absorbed by well regions 113, e.g., by NW region 114, of pixel 104.

In some demonstrative embodiments, photodiode 110 may be configured to collect the electrons from a large area of pixel 104, e.g., substantially an entire area of pixel 104.

Some demonstrative embodiments may enable to increase a collection efficiency of photodiode 110, and/or to significantly increase a quantum efficiency (QE) of the pixel 104, e.g., as described below.

In some demonstrative embodiments, IC 100 may be formed on a thick and/or high resistive silicon, e.g., as described below.

In some demonstrative embodiments, pixel 104 may include an epitaxial (epi) layer 120.

In some demonstrative embodiments, epi layer 120 may be relatively thick, e.g., compared to a thickness of an epi layer of common BSI CMOS pixel sensors.

In some demonstrative embodiments, using a thick epi layer 120 may reduce the amount of, or may even prevent, the electrons from being absorbed at NW region 114, e.g., as described below.

In some demonstrative embodiments, a thickness of epi layer 120 may be of at least 4 micron (um), e.g., compared to a thickness of between 2.6 and 3.5 um of an epi layer of the common BSI CMOS pixel sensors.

In some demonstrative embodiments, the thickness of epi layer 120 may be at least 10 um.

In some demonstrative embodiments, the thickness of epi layer 120 may be at least 15 um.

In another example, epi layer 120 may have any other thickens, for example, a thickness greater than 4 um, for example, between 4 and 18 um, or even greater than 18 um.

In some demonstrative embodiments, epi layer 120 may have a high resistivity, e.g., compared to a resistivity of an epi layer of the common BSI CMOS pixel sensors.

In some demonstrative embodiments, using a high resistivity epi layer 120 may reduce the number of, or even may prevent, the electrons from being absorbed at NW region 114, e.g., as described below.

In some demonstrative embodiments, a resistivity of epi layer 120 may be greater than 30 ohm to centimeter (ohm-cm), e.g., compared to a resistivity of between 10 and 30 ohm-cm of an epi layer of the common BSI CMOS pixel sensors.

In some demonstrative embodiments, a resistivity of epi layer 120 may be greater than 100 ohm to centimeter (ohm-cm).

In some demonstrative embodiments, epi layer 120 may include an absorption area 122 configured to absorb incoming photons, which may be absorbed by pixel array 102.

In some demonstrative embodiments, absorption area 122 may be configured to generate electrons, e.g., responsive to the incoming photons.

In some demonstrative embodiments, epi layer 120 may include a collection area 124 configured to provide the electrons from absorption area 122 to photodiode 110.

In some demonstrative embodiments, collection area 124 may connect, e.g., directly connect, absorption area 122 to photodiode 110, for example, to provide the electrons from absorption area 122 to photodiode 110.

In some demonstrative embodiments, pixel 104 may include a barrier layer 126 configured to separate the absorption area 122 from P-well region 116 and/or N-well region 114.

In some demonstrative embodiments, bather layer 126 may be configured to reduce or even prevent diffusion of the electrons from absorption area 122 to the N-well region 114 and/or to the P-well region 116.

In one example, barrier layer 126 may be configured to cover a large area of pixel 104, e.g., substantially the entire area of pixel 104, for example, except from an area of photodiode 110.

In some demonstrative embodiments, barrier layer 126 may include a deep PW implant. In other embodiments, barrier layer 126 may include any other suitable implant.

In some demonstrative embodiments, bather layer 126 may include a boron implant.

In other embodiments, barrier layer 126 may include any other suitable material.

In some demonstrative embodiments, collection area 124 may extend from absorption area 122 to photodiode 110 through bather layer 126.

In one example, collection area 124 may extend from absorption area 122 to photodiode 110 through barrier layer 126, for example, to provide the electrons from absorption area 122 to photodiode 110, e.g., through bather layer 126.

In some demonstrative embodiments, collection area 124 may enhance a depletion region of photodiode 110, for example, by extending the depletion region of photodiode 110 beyond barrier layer 126.

In one example, the extension of collection area 124 from absorption area 122 to photodiode 110 through barrier layer 126 and within a thick epi layer 120, may reduce, or even prevent, diffusion of the electrons to NW region 114, and/or may enable to collect the electrons from a substantial area, e.g., the entire area, of absorption area 122, for example, from the entire area of pixel 104.

In some demonstrative embodiments, collection area 124 may perform the functionality of an electrostatic lens configured to collect the electrons from absorption area 122, e.g., as described below.

In one example, the electrostatic lens may enable to guide, direct, and/or focus the electrons towards photodiode 110. Accordingly, the electrostatic lens may enhance and/or magnify a collection efficiency of photo diode 110, and/or may reduce, or even prevent, the electrons from being absorbed by well regions 113.

In some demonstrative embodiments, pixel 104 may include a micro lens 128 configured to direct the incoming photons to absorption area 122.

In some demonstrative embodiments, absorption area 122 may be between micro lens 128 and barrier layer 126.

In some demonstrative embodiments, pixel 104 may include an anti-reflective coating (ARC) layer 129, e.g., configured to reduce reflections of micro lens 128.

In some demonstrative embodiments, ARC layer 129 may be between micro lens 128 and absorption area 122.

In some demonstrative embodiments, IC 100 may be configured to prevent interference between circuitry 106 and pixel array 102.

In some demonstrative embodiments, IC 100 may be configured to prevent diffusion of photoelectrons from circuitry 106 to pixel array 102.

In some demonstrative embodiments, IC 100 may include a guard ring 108 configured to separate circuitry 106 from BSI pixel array 102.

In some demonstrative embodiments, guard ring 108 may be between the internal area of IC 100, e.g., the location of BSI pixel array 102, and the periphery of IC 100, e.g., the location of circuitry 106.

In some demonstrative embodiments, guard ring 108 may be configured to prevent the diffusion of the photoelectrons from circuitry 106 to BSI pixel array 102, e.g., as described below with reference to FIG. 3D.

In some demonstrative embodiments, IC 100 may be configured to increase the quantum efficiency of the BSI CMOS pixel array, e.g., pixel array 102, including a plurality of MOS transistors, e.g., MOS transistors 112, and/or low fill factor diodes, for example, photodiode 110, e.g., as described above.

Figure 2:
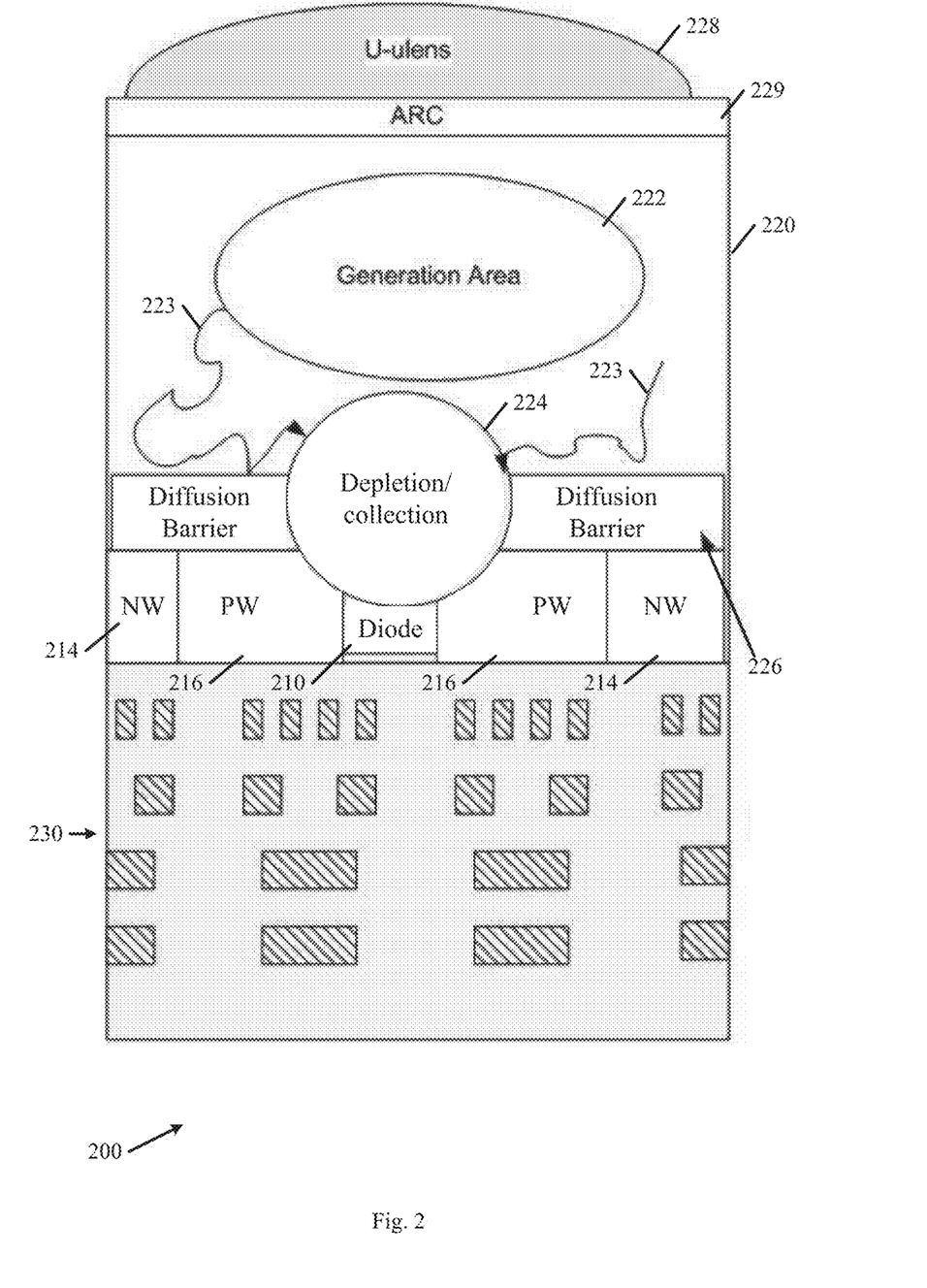
FIG. 2 is a schematic illustration of a Back Side Illumination (BSI) Complementary Metal-Oxide-Semiconductor (CMOS) pixel, in accordance with some demonstrative embodiments.

Reference is made to FIG. 2, which schematically illustrates a BSI CMOS pixel 200, in accordance with some demonstrative embodiments. For example, BSI CMOS pixel 200 may perform the functionality of pixel 104 (FIG. 1).

As shown in FIG. 2, BSI CMOS pixel 200 may include a micro lens 228 and an ARC layer 229. For example, micro lens 228 may perform the functionality of micro lens 128 (FIG. 1), and/or ARC layer 229 may perform the functionality of ARC layer 129 (FIG. 1).

As shown in FIG. 2, BSI CMOS pixel 200 may include wiring layers 230, for example, behind a photodiode 210. For example, photodiode 210 may perform the functionality of photodiode 110 (FIG. 1).

As shown in FIG. 2, photodiode 210 may include a low fill factor diode, e.g., a small diode.

As shown in FIG. 2, photodiode 210 may include the low fill factor diode, for example, to enable one or more NW regions 214 and one or more PW regions 216 of one or more MOS transistors to be introduced into BSI CMOS pixel 200.

As shown in FIG. 2, BSI CMOS pixel 200 may include an epi layer 220. For example, epi layer 220 may perform the functionality of epi layer 120 (FIG. 1).

As shown in FIG. 2, epi layer 220 may be relatively thick, for example, having a thickness of between 4 and 18 um, or any other thickness, e.g., as described above.

As shown in FIG. 2, BSI CMOS pixel 200 may include a barrier layer 226 covering NW regions 214 and PW regions 216. For example, barrier layer 226 may perform the functionality of barrier layer 126 (FIG. 1).

As shown in FIG. 2, epi layer 220 may include an absorption area 222, for example, to absorb incoming photos and to generate electrons 223, e.g., from the incoming photos. For example, absorption area 222 may perform the functionality of absorption area 122 (FIG. 1).

As shown in FIG. 2, epi layer 220 may include a collection area 224 to provide the electrons 223 to photodiode 210. For example, collection area 224 may perform the functionality of collection area 124 (FIG. 1).

As shown in FIG. 2, collection area 224 may extend from absorption area 222 to photo diode 210 through barrier layer 226.

As shown in FIG. 2, collection area 224 may perform the functionality of electrostatic lens configured to guide and/or to direct electrons 223 to photodiode 210, and/or to prevent the electrons 223 from being absorbed at the one or more NW regions 214.

Reference is made to FIGS. 3A-3D, which schematically illustrate respective stages of fabricating an integrated circuit, in accordance with some demonstrative embodiments.

In some demonstrative embodiments, IC 100 (FIG. 1) may be fabricated using the one or more operations describes below with respect to FIGS. 3A-3D.

In some demonstrative embodiments, fabrication of the IC may include a front-side processing operation, a pixel processing operation, and/or a backside processing operation, e.g., as described below.

Figure 3A:
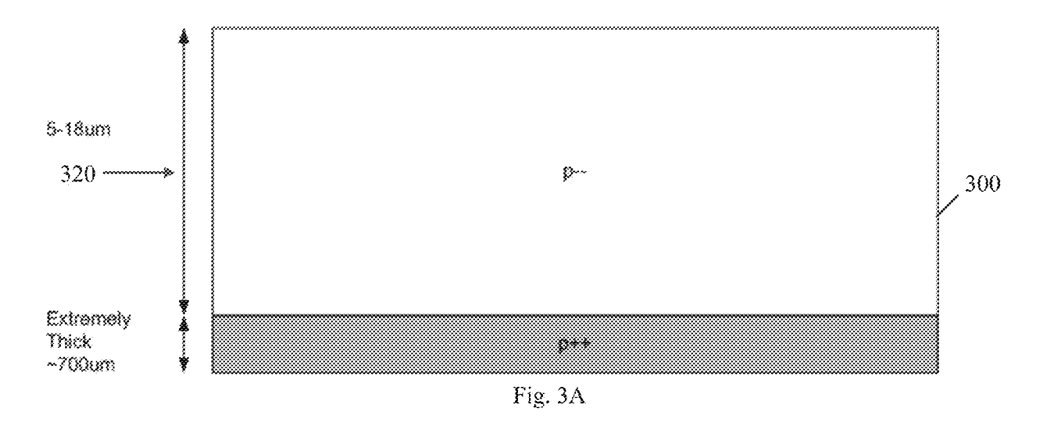
FIGS. 3A-3D are schematic illustrations of respective fabrication stages during fabrication of an integrated chip, in accordance with some demonstrative embodiments.

As shown in FIG. 3A, the IC may be formed on a substrate 300, e.g., a starting material, or a wafer.

As shown in FIG. 3A, substrate 300 may include a thick substrate, e.g., an extremely thick substrate, for example, a substrate having a thickness of about 700 um.

As shown in FIG. 3A, substrate 300 may include a thick epi layer 320 formed on the substrate.

As shown in FIG. 3A, epi layer 320 may be thick, e.g., having a thickness of at least Sum. For example, an epi layer having a thickness of between 5 and 18 um, or any other thickness.

As shown in FIG. 3A, epi layer 320 may have a high resistivity, e.g., a resistivity greater than 100 ohm-cm, or any other resistivity.

Figure 3B:
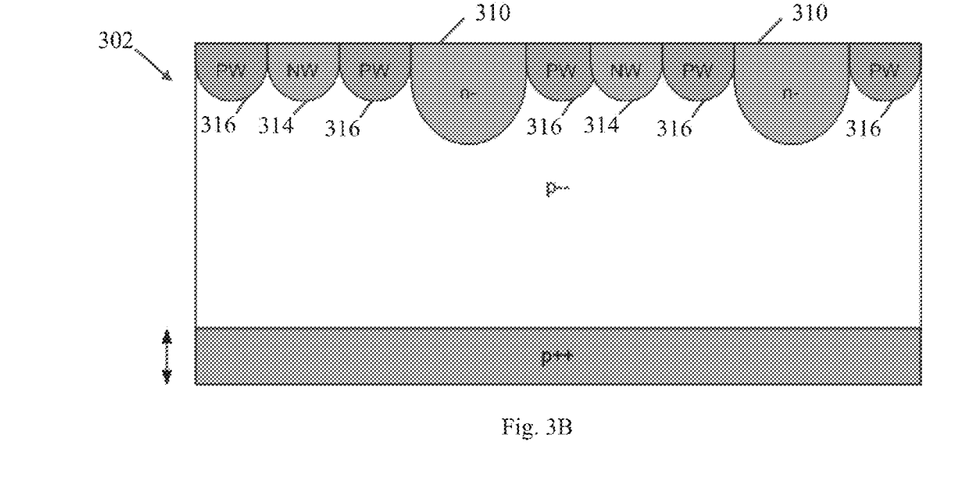

As shown in FIG. 3B, the front-side processing may include forming a pixel array 302. For example, pixel array 302 may perform the functionality of pixel array 102 (FIG. 1)

As shown in FIG. 3B, in one example, pixel array 302 may include a pinned photodiode 310, and one NW region 314.

As shown in FIG. 3B, in one example, pixel array 302 may include two PW regions 316.

In another example, pixel array 302 may include any other diode, e.g., a non-pinned diode, and/or any other number of NW regions 314 and/or PW regions 316.

Figure 3C:
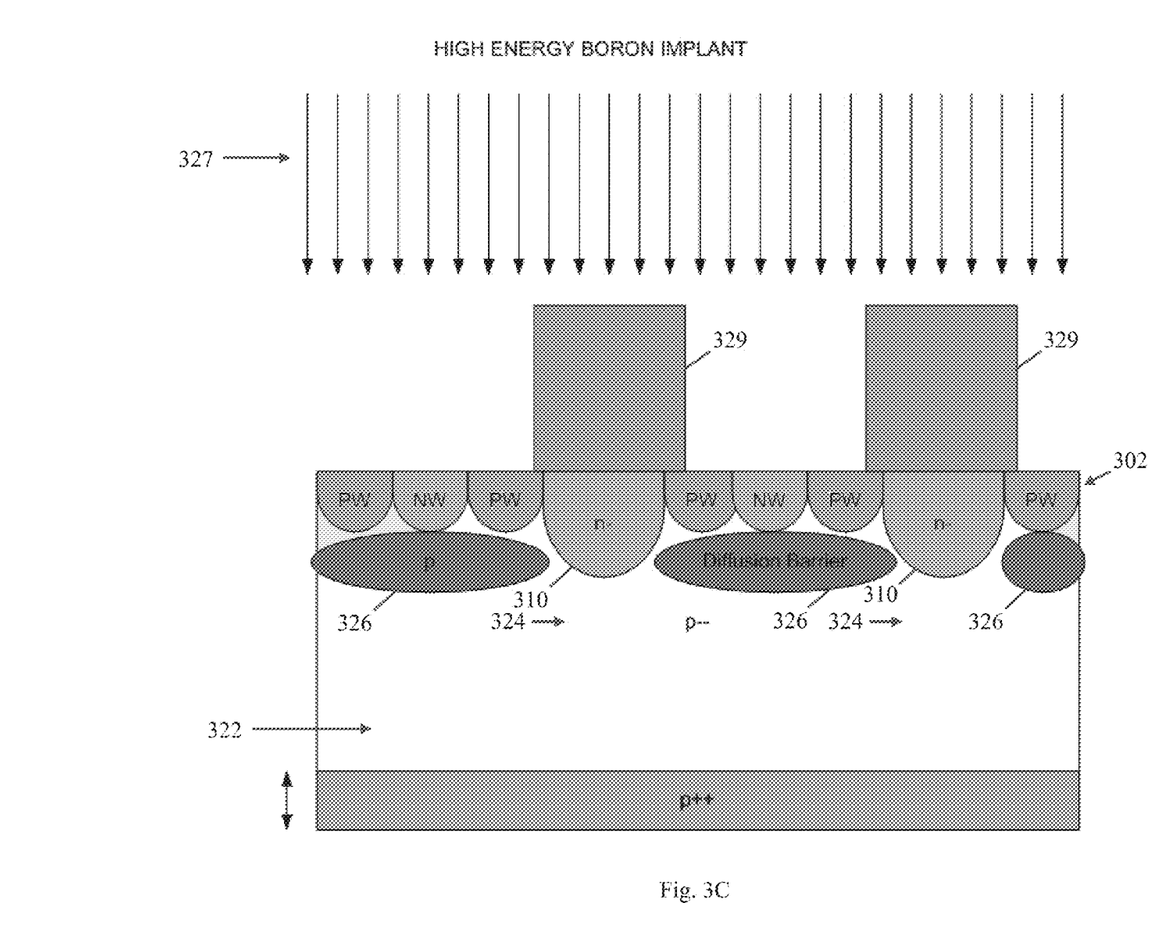

As shown in FIG. 3C, one or more operations may be performed during the pixel processing of the IC, e.g., as described below.

As shown in FIG. 3C, a bather layer 326 may be formed, e.g., using a high-energy boron implant 327.

As shown in FIG. 3C, barrier layer 326 may separate between NW regions 314 and/or PW regions 316, and an absorption area 322 of epi layer 320.

As shown in FIG. 3C, barrier layer 326 may be formed to cover substantially an entire area of pixel array 302, e.g., except from photodiode 310. For example, barrier layer 326 may be formed using one or more lithography barriers 329, e.g., on top of photodiode 310, when performing the boron implant.

In some demonstrative embodiments, a diode metrological junction, e.g., of photodiode 310, may include a deep implant. As a result, a depletion region of photodiode 310 may reach a depth beyond barrier layer 326.

As shown in FIG. 3C, photodiode 310 may be formed using a deep implant of n-, for example, to extend a depletion region of photo diode 310 through barrier layer 326, and/or to connect photodiode 310 to a connection area 324 of epi layer 320.

In some demonstrative embodiments, fabricating the pixel array 302 over the high resistive silicon may create one or more problems to predesigned circuits.

In one example, the high resistive silicon may create isolation problems, for example, between NW and NW regions, between Native transistors and/or between bipolar transistors.

In some demonstrative embodiments, an implant, e.g., a deep implant, may be configured to create conditions of a low resistivity substrate at the bottom of, e.g., each NW and PW, which are used in the periphery of the IC, for example, to overcome the isolation problems.

In some demonstrative embodiments, the front-side processing of the substrate may include forming an isolated PW, e.g., as described below.

Figure 3D:
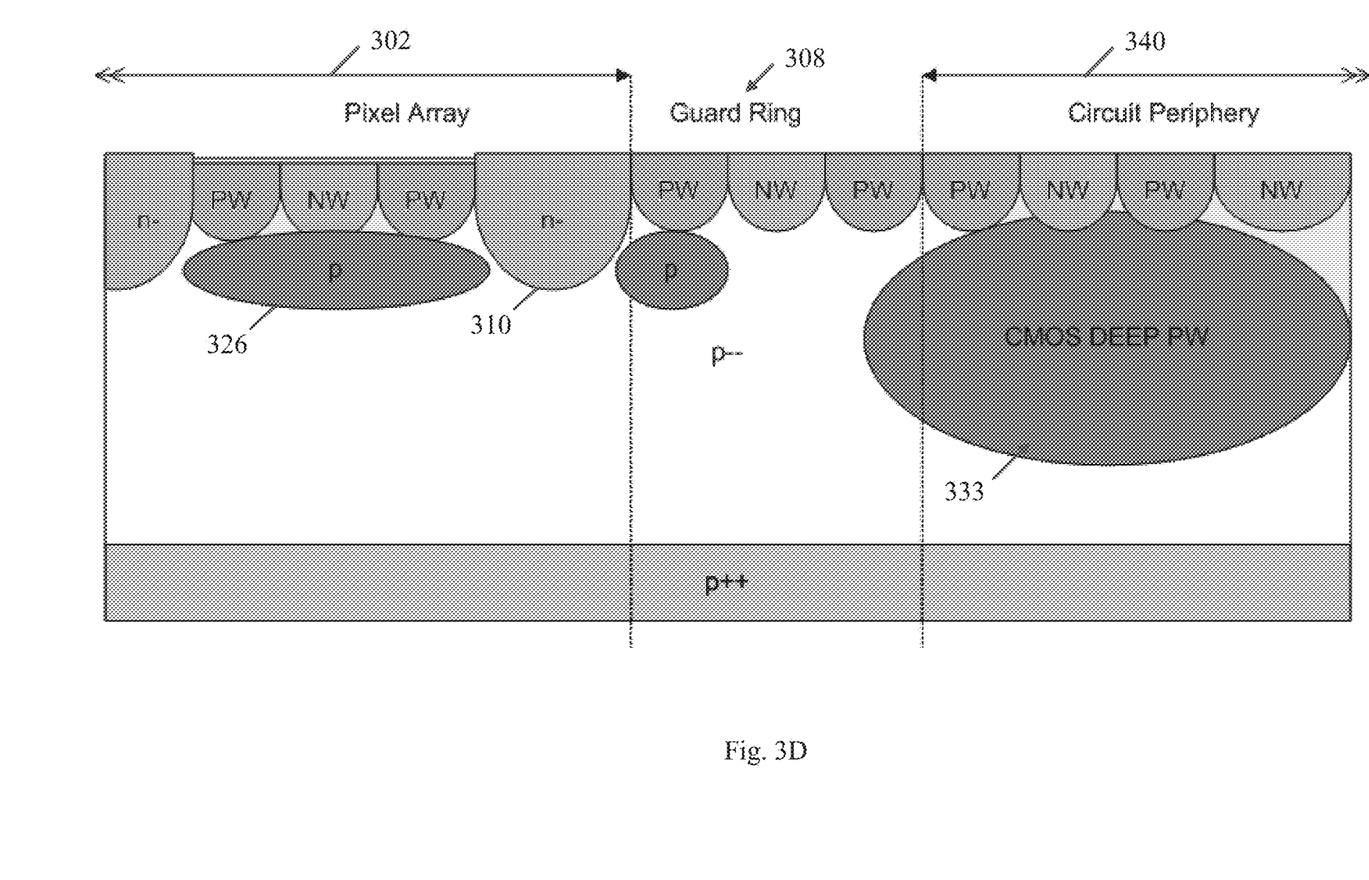

As shown in FIG. 3D, the front-side processing may include forming a deep PW implant 333 configured to create a low resistivity substrate at the bottom of NW and PW regions at a periphery area 340 of the integrated circuit, e.g., an area of circuit 106 (FIG. 1).

As shown in FIG. 3D, a guard ring 308 may be formed to protect the pixel array 302, for example, from collecting photoelectrons diffusion from the periphery area 340 of the integrated circuit.

In one example, guard ring 308 may be configured to prevent injection from the periphery of pixel array 102 (FIG. 1) to the center of pixel array 102 (FIG. 1).

In some demonstrative embodiments, the backside processing of the substrate may include bonding, thinning, and/or passivation operations, e.g., using one or more backside processing CMOS techniques.

In some demonstrative embodiments, the backside processing of the substrate may include consideration of backside alignment for metal grid or color filter array (CFA), and/or PAD opening, e.g., for the thick and high resistive silicon.

Figure 4:
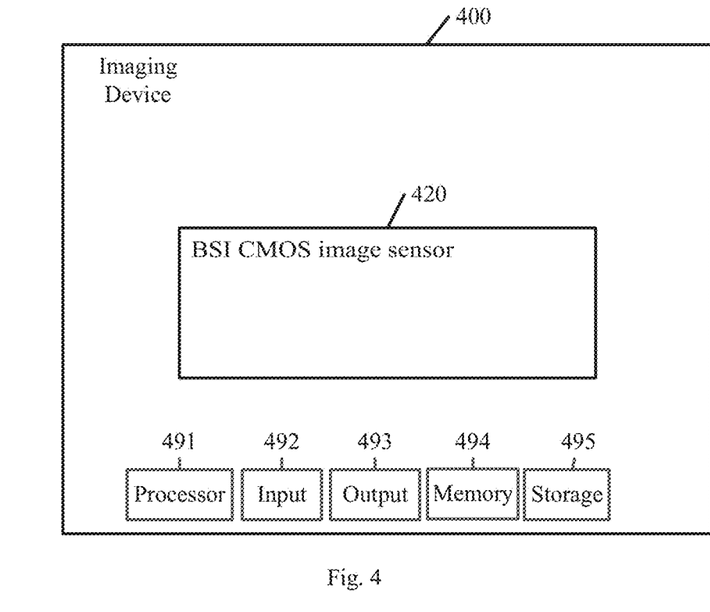
FIG. 4 is a schematic illustration of an imaging device, in accordance with some demonstrative embodiments.

Reference is made to FIG. 4, which schematically illustrates an imaging device 400, in accordance with some demonstrative embodiments.

In some demonstrative embodiments, imagine device 400 may be configured to capture one or more images.

In one example, imagine device 400 may capture, record, process, handle and/or store one or more photos, videos, movies, clips and/or the like.

In some demonstrative embodiments, imagine device 400 may include a camera, e.g., a digital camera, a digital video camera, a digital photo camera, a webcam, a mobile device, an imaging device, a medical imaging device, a mobile phone, e.g., including a camera, a Smartphone, and/or the like.

In some demonstrative embodiments, imaging device 400 may include a BSI image sensor 420. For example, BSI image sensor 420 may include IC 100 (FIG. 1).

In some demonstrative embodiments, BSI image sensor 420 may be configured to capture the one or more images, for example, by converting incoming photons into electronic signals.

In some demonstrative embodiments, image sensing device 400 may also include, for example, a processor 491, an input unit 492, an output unit 493, a memory unit 494, and/or a storage unit 495. Imaging device 400 may optionally include other suitable hardware components and/or software components. In some demonstrative embodiments, some or all of the components of image sensing device 400 may be enclosed in a common housing or packaging, and may be interconnected or operably associated using one or more wired or wireless links. In other embodiments, components of image sensing device 400 may be distributed among multiple or separate devices.

In some demonstrative embodiments, processor 491 may include, for example, a Central Processing Unit (CPU), a Digital Signal Processor (DSP), one or more processor cores, a single-core processor, a dual-core processor, a multiple-core processor, a microprocessor, a host processor, a controller, a plurality of processors or controllers, a chip, a microchip, one or more circuits, circuitry, a logic unit, an Integrated Circuit (IC), an Application-Specific IC (ASIC), or any other suitable multi-purpose or specific processor or controller. For example, processor 491 executes instructions, for example, of an Operating System (OS) of image sensing device 400 and/or of one or more suitable applications.

In some demonstrative embodiments, memory unit 494 may include, for example, a Random Access Memory (RAM), a Read Only Memory (ROM), a Dynamic RAM (DRAM), a Synchronous DRAM (SD-RAM), a flash memory, a volatile memory, a non-volatile memory, a cache memory, a buffer, a short term memory unit, a long term memory unit, or other suitable memory units. Storage unit 495 include, for example, a hard disk drive, a floppy disk drive, a Compact Disk (CD) drive, a CD-ROM drive, a DVD drive, or other suitable removable or non-removable storage units. For example, memory unit 494 and/or storage unit 495, for example, may store data processed by image sensing device 400.

In some demonstrative embodiments, input unit 492 may include, for example, a keyboard, a keypad, a mouse, a touch-screen, a touch-pad, a track-ball, a stylus, a microphone, or other suitable pointing device or input device. Output unit 493 includes, for example, a monitor, a screen, a touch-screen, a flat panel display, a Cathode Ray Tube (CRT) display unit, a Liquid Crystal Display (LCD) display unit, a plasma display unit, one or more audio speakers or earphones, or other suitable output devices.

EXAMPLES

The following examples pertain to further embodiments.

Example 1 includes a back-side illumination (BSI) complementary metal-oxide-semiconductor (CMOS) pixel array comprising a plurality of pixels, a pixel of the plurality of pixels comprising one or more Metal-Oxide-Semiconductor (MOS) transistors comprising one or more well regions, a well region of the one or more well regions comprising an N-Well (NW) region or a P-well (PW) region; a photodiode; an epitaxial (epi) layer comprising an absorption area and a collection area, the absorption area to absorb incoming photons and to generate electrons responsive to absorbed photons, and the collection area connecting the absorption area to the photodiode to provide the electrons from the absorption area to the photodiode; and a barrier layer separating the absorption area from the one or more well regions.

Example 2 includes the subject matter of Example 1, and optionally, wherein the photodiode comprises a low fill factor (FF) diode.

Example 3 includes the subject matter of Example 1, and optionally, wherein the collection area extends from the absorption area to the photodiode through the barrier layer.

Example 4 includes the subject matter of Example 1, and optionally, wherein the collection area is configured to perform the functionality of an electrostatic lens to collect the electrons from the absorption area.

Example 5 includes the subject matter of Example 1, and optionally, wherein the barrier layer is configured to prevent diffusion of the electrons from the absorption area to the well regions.

Example 6 includes the subject matter of Example 1, and optionally, wherein a thickness of the epi layer is at least 4 micron (um).

Example 7 includes the subject matter of Example 1, and optionally, wherein a thickness of the epi layer is at least 10 micron (um).

Example 8 includes the subject matter of Example 1, and optionally, wherein a thickness of the epi layer is at least 15 micron (um).

Example 9 includes the subject matter of Example 1, and optionally, wherein a resistivity of the epi layer is greater than 100 ohm to centimeter (ohm-cm).

Example 10 includes the subject matter of Example 1, and optionally, comprising a micro lens, the absorption area is between the micro lens and the barrier layer.

Example 11 includes the subject matter of Example 1, and optionally, comprising an anti-reflective coating (ARC) layer, the ARC layer is between the micro lens and the absorption area.

Example 12 includes the subject matter of Example 1, and optionally, wherein the one or more MOS transistors comprise one or more transistors selected from a group consisting of one or more P-type MOS (PMOS) transistors, and one or more N-type MOS (NMOS) transistors.

Example 13 includes the subject matter of Example 1, and optionally, wherein the barrier layer comprises a deep PW implant.

Example 14 includes the subject matter of Example 1, and optionally, wherein the barrier layer comprises a boron implant.

Example 15 includes the subject matter of Example 1, and optionally, wherein the photodiode comprises a fully pinned diode.

Example 16 includes the subject matter of Example 1, and optionally, wherein the photodiode comprises a non-pinned diode.

Example 17 includes a complementary metal-oxide-semiconductor (CMOS) integrated circuit (IC) comprising a circuitry; and a back-side illumination (BSI) pixel array comprising a plurality of pixels, a pixel of the plurality of pixels comprising one or more Metal-Oxide-Semiconductor (MOS) transistors comprising one or more well regions, a well region of the one or more well regions comprising an N-Well (NW) region or a P-well (PW) region; a photodiode; an epitaxial (epi) layer comprising an absorption area and a collection area, the absorption area to absorb incoming photons and to generate electrons responsive to the absorbed photons, and the collection area connecting the absorption area to the photodiode to provide the electrons from the absorption area to the photodiode; and a bather layer separating the absorption area from the well regions.

Example 18 includes the subject matter of Example 17, and optionally, comprising a guard ring separating the circuitry from the BSI pixel array.

Example 19 includes the subject matter of Example 18, and optionally, wherein the guard ring is configured to prevent diffusion of photoelectrons from the circuitry to the BSI pixel array.

Example 20 includes the subject matter of Example 17, and optionally, wherein the photodiode comprises a low fill factor (FF) diode.

Example 21 includes the subject matter of Example 17, and optionally, wherein the collection area extends from the absorption area to the photodiode through the barrier layer.

Example 22 includes the subject matter of Example 17, and optionally, wherein the collection area is configured to perform the functionality of an electrostatic lens to collect the electrons from the absorption area.

Example 23 includes the subject matter of Example 17, and optionally, wherein the barrier layer is configured to prevent diffusion of the electrons from the absorption area to the well regions.

Example 24 includes the subject matter of Example 17, and optionally, wherein a thickness of the epi layer is at least 4 micron (um).

Example 25 includes the subject matter of Example 17, and optionally, wherein a thickness of the epi layer is at least 10 micron (um).

Example 26 includes the subject matter of Example 17, and optionally, wherein a thickness of the epi layer is at least 15 micron (um).

Example 27 includes the subject matter of Example 17, and optionally, wherein a resistivity of the epi layer is greater than 100 ohm to centimeter (ohm-cm).

Example 28 includes the subject matter of Example 17, and optionally, comprising a micro lens, the absorption area is between the micro lens and the barrier layer.

Example 29 includes the subject matter of Example 29, and optionally, comprising an anti-reflective coating (ARC) layer, the ARC layer is between the micro lens and the absorption area.

Example 30 includes the subject matter of Example 17, and optionally, wherein the one or more MOS transistors comprise one or more transistors selected from a group consisting of one or more P-type MOS (PMOS) transistors and one or more N-type MOS (NMOS) transistors.

Example 31 includes the subject matter of Example 17, and optionally, wherein the barrier layer comprises a deep PW implant.

Example 32 includes the subject matter of Example 17, and optionally, wherein the barrier layer comprises a boron implant.

Example 33 includes the subject matter of Example 17, and optionally, wherein the photodiode comprises a fully pinned diode.

Example 34 includes the subject matter of Example 17, and optionally, wherein the photodiode comprises a non-pinned diode Example 35 includes an imaging device comprising a memory; an input; an output; a processor; and a complementary metal-oxide-semiconductor (CMOS) integrated circuit (IC) comprising a circuitry; and a back-side illumination (BSI) pixel array comprising a plurality of pixels, a pixel of the plurality of pixel sensors comprising one or more Metal-Oxide-Semiconductor (MOS) transistors comprising one or more well regions, a well region of the one or more well regions comprising an N-Well (NW) region or a P-well (PW) region; a photodiode; an epitaxial (epi) layer comprising an absorption area and a collection area, the absorption area to absorb incoming photons and to generate electrons responsive to the absorbed photons, and the collection area connecting the absorption area to the photodiode to provide the electrons from the absorption area to the photodiode; and a barrier layer separating the absorption area from the well regions.

Example 36 includes the subject matter of Example 35, and optionally, comprising a digital camera or a Smartphone.

Example 37 includes the subject matter of Example 35, and optionally, comprising a guard ring separating the circuitry from the BSI pixel array.

Example 38 includes the subject matter of Example 37, and optionally, wherein the guard ring is configured to prevent diffusion of photoelectrons from the circuitry to the BSI pixel array.

Example 39 includes the subject matter of Example 35, and optionally, wherein the photodiode comprises a low fill factor (FF) diode.

Example 40 includes the subject matter of Example 35, and optionally, wherein the collection area extends from the absorption area to the photodiode through the barrier layer.

Example 41 includes the subject matter of Example 35, and optionally, wherein the collection area is configured to perform the functionality of an electrostatic lens to collect the electrons from the absorption area.

Example 42 includes the subject matter of Example 35, and optionally, wherein the barrier layer is configured to prevent diffusion of the electrons from the absorption area to the well regions.

Example 43 includes the subject matter of Example 35, and optionally, wherein a thickness of the epi layer is at least 4 micron (um).

Example 44 includes the subject matter of Example 35, and optionally, wherein a thickness of the epi layer is at least 10 micron (um).

Example 45 includes the subject matter of Example 35, and optionally, wherein a thickness of the epi layer is at least 15 micron (um).

Example 46 includes the subject matter of Example 35, and optionally, wherein a resistivity of the epi layer is greater than 100 ohm to centimeter (ohm-cm).

Example 47 includes the subject matter of Example 35, and optionally, comprising a micro lens, the absorption area is between the micro lens and the barrier layer.

Example 48 includes the subject matter of Example 29, and optionally, comprising an anti-reflective coating (ARC) layer, the ARC layer is between the micro lens and the absorption area.

Example 49 includes the subject matter of Example 35, and optionally, wherein the one or more MOS transistors comprise one or more transistors selected from a group consisting of one or more P-type MOS (PMOS) transistors and one or more N-type MOS (NMOS) transistors.

Example 50 includes the subject matter of Example 35, and optionally, wherein the barrier layer comprises a deep PW implant.

Example 51 includes the subject matter of Example 35, and optionally, wherein the barrier layer comprises a boron implant.

Example 52 includes the subject matter of Example 35, and optionally, wherein the photodiode comprises a fully pinned diode.

Example 53 includes the subject matter of Example 35, and optionally, wherein the photodiode comprises a non-pinned diode Example 54 includes a method of fabricating a complementary metal-oxide-semiconductor (CMOS) integrated circuit (IC) comprising a pixel array, the method comprising forming on an epitaxial layer a photodiode and one or more Metal-Oxide-Semiconductor (MOS) transistors comprising one or more well regions, a well region of the one or more well regions comprising an N-Well (NW) region or a P-well (PW) region, wherein the epitaxial layer comprising an absorption area and a collection area, the absorption area configured to absorb incoming photons and to generate electrons responsive to the absorbed photons, and the collection area configured to connect the absorption area to the photodiode to provide the electrons from the absorption area to the photodiode; and forming a barrier layer configured to separate the absorption area from the well regions.

Example 55 includes the subject matter of Example 54, and optionally, comprising forming a guard ring configured to separate a circuitry of the IC from the BSI pixel array.

Example 56 includes the subject matter of Example 55, and optionally, wherein the guard ring is configured to prevent diffusion of photoelectrons from the circuitry to the BSI pixel array.

Example 57 includes the subject matter of Example 54, and optionally, wherein the photodiode comprises a low fill factor (FF) diode.

Example 58 includes the subject matter of Example 54, and optionally, wherein the collection area extends from the absorption area to the photodiode through the barrier layer.

Example 59 includes the subject matter of Example 54, and optionally, wherein the collection area is configured to perform the functionality of an electrostatic lens to collect the electrons from the absorption area.

Example 60 includes the subject matter of Example 54, and optionally, wherein the barrier layer is configured to prevent diffusion of the electrons from the absorption area to the well regions.

Example 61 includes the subject matter of Example 54, and optionally, wherein a thickness of the epi layer is at least 4 micron (um).

Example 62 includes the subject matter of Example 54, and optionally, wherein a thickness of the epi layer is at least 10 micron (um).

Example 63 includes the subject matter of Example 54, and optionally, wherein a thickness of the epi layer is at least 15 micron (um).

Example 64 includes the subject matter of Example 54, and optionally, wherein a resistivity of the epi layer is greater than 100 ohm to centimeter (ohm-cm).

Example 65 includes the subject matter of Example 54, and optionally, comprising forming a micro lens, wherein the absorption area is between the micro lens and the barrier layer.

Example 66 includes the subject matter of Example 65, and optionally, comprising forming an anti-reflective coating (ARC) layer, the ARC layer is between the micro lens and the absorption area.

Example 67 includes the subject matter of Example 54, and optionally, wherein the one or more MOS transistors comprise one or more transistors selected from a group consisting of one or more P-type MOS (PMOS) transistors and one or more N-type MOS (NMOS) transistors.

Example 68 includes the subject matter of Example 54, and optionally, wherein the barrier layer comprises a deep PW implant.

Example 69 includes the subject matter of Example 54, and optionally, wherein the barrier layer comprises a boron implant.

Example 70 includes the subject matter of Example 54, and optionally, wherein the photodiode comprises a fully pinned diode.

Example 71 includes the subject matter of Example 54, and optionally, wherein the photodiode comprises a non-pinned diode Functions, operations, components and/or features described herein with reference to one or more embodiments, may be combined with, or may be utilized in combination with, one or more other functions, operations, components and/or features described herein with reference to one or more other embodiments, or vice versa.

While certain features have been illustrated and described herein, many modifications, substitutions, changes, and equivalents may occur to those skilled in the art. It is, therefore, to be understood that the appended claims are intended to cover all such modifications and changes as fall within the true spirit of the invention.

What is claimed is:

1. A back-side illumination (BSI) complementary metal-oxide-semiconductor (CMOS) pixel array comprising:
   a plurality of pixels, a pixel of said plurality of pixels comprising:
   one or more Metal-Oxide-Semiconductor (MOS) transistors comprising one or more well regions, a well region of said one or more well regions comprising an N-Well (NW) region or a P-well (PW) region;
   a photodiode;
   an epitaxial (epi) layer comprising an absorption area and a collection area, said absorption area to absorb incoming photons and to generate electrons responsive to absorbed photons, and said collection area connecting said absorption area to said photodiode to provide said electrons from said absorption area to said photodiode; and
   a barrier layer separating said absorption area from said one or more well regions.

2. The BSI CMOS pixel array of claim 1, wherein said photodiode comprises a low fill factor (FF) diode.

3. The BSI CMOS pixel array of claim 1, wherein said collection area extends from said absorption area to said photodiode through said barrier layer.

4. The BSI CMOS pixel array of claim 1, wherein said collection area is configured to perform the functionality of an electrostatic lens to collect said electrons from said absorption area.

5. The BSI CMOS pixel array of claim 1, wherein said barrier layer is configured to prevent diffusion of said electrons from said absorption area to said well regions.

6. The BSI CMOS pixel array of claim 1, wherein a thickness of said epi layer is at least 4 micron (um).

7. The BSI CMOS pixel array of claim 1, wherein a thickness of said epi layer is at least 10 micron (um).

8. The BSI CMOS pixel array of claim 1, wherein a thickness of said epi layer is at least 15 micron (um).

9. The BSI CMOS pixel array of claim 1, wherein a resistivity of said epi layer is greater than 100 ohm to centimeter (ohm-cm).

10. The BSI CMOS pixel array of claim 1 comprising a micro lens, said absorption area is between said micro lens and said barrier layer.

11. The BSI CMOS pixel array of claim 10 comprising an anti-reflective coating (ARC) layer, said ARC layer is between said micro lens and said absorption area.

12. The BSI CMOS pixel array of claim 1, wherein said one or more MOS transistors comprise one or more transistors selected from a group consisting of one or more P-type MOS (PMOS) transistors and one or more N-type MOS (NMOS) transistors.

13. The BSI CMOS pixel array of claim 1, wherein said barrier layer comprises a deep PW implant.

14. The BSI CMOS pixel array of claim 1, wherein said barrier layer comprises a boron implant.

15. The BSI CMOS pixel array of claim 1, wherein said photodiode comprises a fully pinned diode.

16. A complementary metal-oxide-semiconductor (CMOS) integrated circuit (IC) comprising:
   a circuitry; and
   a back-side illumination (BSI) pixel array comprising:
      a plurality of pixels, a pixel of said plurality of pixels comprising:
      one or more Metal-Oxide-Semiconductor (MOS) transistors comprising one or more well regions, a well region of said one or more well regions comprising an N-Well (NW) region or a P-well (PW) region;
      a photodiode;
      an epitaxial (epi) layer comprising an absorption area and a collection area, said absorption area to absorb incoming photons and to generate electrons responsive to said absorbed photons, and said collection area connecting said absorption area to said photodiode to provide said electrons from said absorption area to said photodiode; and
      a barrier layer separating said absorption area from said well regions.

17. The CMOS IC of claim 16 comprising a guard ring separating said circuitry from said BSI pixel array.

18. The CMOS IC of claim 17, wherein said guard ring is configured to prevent diffusion of photoelectrons from said circuitry to said BSI pixel array.

19. An imaging device comprising:
   a memory;
   an input;
   an output;
   a processor; and
   a complementary metal-oxide-semiconductor (CMOS) integrated circuit (IC) comprising:
      a circuitry; and
      a back-side illumination (BSI) pixel array comprising:
         a plurality of pixels, a pixel of said plurality of pixel sensors comprising:
         one or more Metal-Oxide-Semiconductor (MOS) transistors comprising one or more well regions, a well region of said one or more well regions comprising an N-Well (NW) region or a P-well (PW) region;

a photodiode;

an epitaxial (epi) layer comprising an absorption area and a collection area, said absorption area to absorb incoming photons and to generate electrons responsive to said absorbed photons, and said collection area connecting said absorption area to said photodiode to provide said electrons from said absorption area to said photodiode; and a barrier layer separating said absorption area from said well regions.

20. The imaging device of claim 19 comprising a digital camera or a Smartphone.

* * * * *